United States Patent
Yamamoto

(10) Patent No.: US 6,215,699 B1
(45) Date of Patent: Apr. 10, 2001

(54) NONVOLATILE SEMICONDUCTOR STORAGE DEVICE HAVING MAIN BLOCK AND REDUNDANCY BLOCK FORMED ON DIFFERENT WELLS

(75) Inventor: Kaoru Yamamoto, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/317,821

(22) Filed: May 25, 1999

(30) Foreign Application Priority Data

May 25, 1998 (JP) .................................................. 10-142734

(51) Int. Cl.$^7$ .............................. G11C 16/06; G11C 7/00
(52) U.S. Cl. ................................ 365/185.09; 365/185.11; 365/200
(58) Field of Search .......................... 365/185.09, 185.11, 365/185.13, 185.17, 185.27, 200, 185.33

(56) References Cited

U.S. PATENT DOCUMENTS

| | | | |
|---|---|---|---|
| 5,068,697 | * 11/1991 | Noda et al. ........................... | 357/23.5 |
| 5,399,891 | * 3/1995 | Yiu et al. ........................ | 365/185.09 |
| 5,509,018 | * 4/1996 | Niijima et al. ...................... | 371/10.2 |
| 5,910,916 | * 6/1999 | Akaogi et al. .................. | 365/185.29 |

FOREIGN PATENT DOCUMENTS

| | | |
|---|---|---|
| 6-150688 | 5/1994 | (JP) . |
| 6-290597 | 10/1994 | (JP) . |

OTHER PUBLICATIONS

32Mb AND Flash Memory by Atsushi Nozoe, Device Development Center, Hitachi, Ltd., Tokyo, Japan, The Institute of Electronics, Information and Communication Engineers, Technical Report of IEICE, pp. 63–68. (English Abstract).

"A New Cell Structure for Sub–quarter Micron High Density Flash Memory," by Yoshimitsu Yamauchi, Masanori, Yoshimi, Sinichi Sato, Hiroki Tabuchi, Nobuyuki Takenaka and Keizo Sakiyam, IEDM Technical Digest, pp. 267–270, 1995.

* cited by examiner

Primary Examiner—Son Mai
(74) Attorney, Agent, or Firm—Morrison & Foerster LLP

(57) ABSTRACT

There is provided a nonvolatile semiconductor storage device that has a high reliability free from malfunction of redundancy block during erase operation and causes no disadvantage in terms of layout area thereof. A memory array is a virtual ground type memory array employing ACT memory cells MC. A redundancy block 35 uses a redundancy sector constructed of the ACT memory cells MC of one line connected to one redundancy word line RWL as a unit of redundancy. Then, the redundancy block 35 and a main block 31 are formed on different p-wells of a triple well while being electrically insulated from each other. Thus, by applying a negative voltage to only the p-well of the main block 31 and keeping the p-well of the redundancy block 35 at zero volt during an erase operation, the redundancy block 35 is not erased. Further, there is no need for providing a source line level supply circuit besides a main block control circuit 32, so that no disadvantage occurs in terms of layout area.

6 Claims, 7 Drawing Sheets

NONVOLATILE SEMICONDUCTOR STORAGE DEVICE HAVING MAIN BLOCK AND REDUNDANCY BLOCK FORMED ON DIFFERENT WELLS

BACKGROUND OF THE INVENTION

The present invention relates to a nonvolatile semiconductor storage device having a redundancy function, and in particular, to a nonvolatile semiconductor storage device capable of executing erase and write operations in blocks.

A flash EEPROM (collectively erasing type electrically erasable programmable read-only memory) has conventionally been mainly used as a code storage for a portable telephone or BIOS (basic input output systems). However, in recent years, there has been a growing demand for the use of the flash EEPROM as a data storage for a digital still camera or the like. The flash EEPROM for data storage use is required to execute rewriting particularly in blocks of a small size.

As a flash EEPROM that satisfies the above requirement, there is an AND type flash memory announced as a communication technique at the meeting of The Institute of Electronics, Information and Communication Engineers in May 1995. The AND type flash memory is a flash EEPROM that has a parallel line structure in which the data line and the source line are laminated and executes writing and erasing by the FN (Fowler-Nordheim) tunnel effect.

FIG. 4 shows the array structure of one block of the AND type flash memory. In FIG. 4, n+1 (=64) memory cells MC00, MC01, . . . , MC0n are connected parallel between a sub-data line SD0 that diverges from a main data line D0 via a drain side selection transistor DT0 and a sub-source line SS0 that diverges from a main source line S via a source side selection transistor ST0. Then, by using this as one unit (AND unit), m+1 (corresponding to 512 bytes) AND units are arranged on n+1 (=64) word lines WL0, WL1, . . . , WLn. Then, a plurality of blocks, which are each constructed of (n+1)×(m+1) memory cells MC served as one block, are arranged with main data lines D0 through Dm commonly owned, constituting the AND type flash memory array.

As described above, the data lines are stratified into main data lines D0, D1, . . . , Dm and sub-data lines SD0, SD1, . . . , SDm, while the source lines are stratified into the main source line S and the sub-source lines SS0, SS1, . . . , SSm. By disconnecting the sub-data line SD of the non-selected block from the main data line D by the drain side selection transistor DT and disconnecting the sub-source line SS from the main source line S by the source side selection transistor ST, only the selected block can be connected to the main data line D and the main source line S. As a result, even if the write and erase operations are executed every one word line WL, the memory cells MC connected to the word line WL of the non-selected block receives no influence of disturbance. This allows the achievement of the write and erase operations in batches of sectors SC constructed of the memory cells MC (for example, memory cells MC00, MC10, . . . , MCm0) comprised of a transistor whose gate is connected to one word line WL (for example, word line WL0).

FIGS. 5A and 5B show the fundamental operation of the AND type flash memory. The AND type flash memory executes the writing and erasing by the FN tunnel effect as described earlier. As shown in FIG. 5A, the writing is executed by reducing the threshold voltage through applying a high voltage Vd to the drain 1 of the transistor that constitutes the memory cell MC so as to discharge electrons from the a floating gate 2 to the drain 1 side. In contrast to this, as shown in FIG. 5B, the erasing is executed by increasing the threshold voltage through applying a high voltage Vg to a gate 3 so as to inject electrons from a substrate 4 into the floating gate 2. In order to achieve the write and erase operations in batches of sectors while preventing the disturbance, no voltage is applied to the substrate 4 in either operation.

In the AND type flash memory, which can execute write and erase operations in batches of sectors SC as described earlier, the redundancy processing is executed in batches of sectors SC. FIG. 6 shows the principle of the redundancy processing of the AND type flash memory. During the write and erase operations, if the sector relevant to the selected word line WL is a defective sector 6a, then this defective sector 6a is replaced by a redundancy sector 7 provided inside a memory array 5.

By this operation, the redundancy replacement block can be reduced to one sector 6 at a minimum, so that the yield can be improved by virtue of the size of one or more replacement sectors smaller than in the case of replacement in redundancy use blocks constructed of a plurality of redundancy sectors.

As a flash EEPROM that is able to execute the write and erase operations in small-scale units and to achieve a higher integration than in the AND type flash memory, there is a virtual ground type flash memory. As described in detail later, this virtual ground type flash memory is a high-density memory array that has a reduced number of contacts (bit line contacts) of bit line with metal electrodes and needs no source line. This high-density arrangement is achieved by forming the bit line with diffused layer wiring for the stratification of the bit line and using an adjacent bit line as a source line.

It is to be noted that this memory array receives a great influence of disturbance in selecting the bit line during the write and erase operations, and accordingly, there is needed a method for avoiding the influence of the disturbance. As an example of the method, there is an ACT type flash memory employing an ACT (Asymmetrical Contactless Transistor) published in "A New Cell Structure for Sub-quarter Micron High Density Flash Memory" IEDM Technical Digest, pp. 269–270, 1995.

The ACT type flash memory uses the FN tunnel effect for the write and erase operations and has a virtual ground array structure in which an identical bit line is commonly owned by adjacent two memory cells connected to an identical word line WL as its memory array structure as shown in FIG. 7. As described above, the number of bit line contacts is reduced by commonly using the sub-bit line for two memory cells and using the diffusion layer for the sub-bit line, enabling high integration through the substantial reduction in the memory cell area. It is to be noted that FIG. 7 shows a main bit line MBLx (x: integer), a sub-bit line SBLx formed of a diffusion layer, a word line WLx and a select gate selection line SGx. The mark<represents the contact of the main bit line MBLx with the sub-bit line SBLX in different strata.

The ACT type flash memory having the above construction operates as follows. It is to be noted that the FN tunnel effect is used for the write and erase operations. During the write operation, as shown in FIG. 8A, a negative voltage (−9 V in the figure) is applied to the gate (word line WL) of the transistor that constitutes each memory cell, a positive voltage (+5 V in the figure) is applied to the sub-bit line SB on the drain side and the sub-bit line SB on the source side is put in the floating state. Then, the FN tunnel effect occurs between the n+ side of the sub-bit line SB located on the drain side and the floating gate FG, thereby extracting electrons from the floating gate FG to the sub-bit line SB located on the drain side. Thus, the writing is executed by reducing the threshold voltage of the transistor.

During the erase operation, as shown in FIG. 8B, a high positive voltage (10 V in the figure) is applied to the gate (word line WL) of the transistor that constitutes each memory cell, a negative voltage (−8 V in the figure) is applied to the sub-bit lines SB on the drain and source sides and to the substrate (P− region) Then, the FN tunnel effect occurs between the channel region of the substrate and the floating gate FG, thereby injecting electrons into the floating gate FG. Thus, the erasing is executed by increasing the threshold voltage of the transistor. No description is provided for the read and verify operations.

The flash memory is generally constructed of the memory array and peripheral circuits (not shown) such as a row decoder and a column decoder. Then, during the erase operation, the peripheral circuits are electrically insulated from the memory array so that the peripheral circuits are not affected when the negative voltage is applied to the substrate (P− region). This electrical insulation is effected, as shown in FIG. 9, by forming the peripheral circuits on a triple well structure in which an n-well (n−) is formed on the p-sub-substrate and further a p-well (p−) is formed on the n-well.

When the nonvolatile semiconductor storage device has a large capacity as described above, a redundancy function is required for relieve the defective memory cell or the defective sector for the improvement of yield. As a redundancy function described above, there is proposed the following redundancy function besides the redundancy function of the AND type flash memory.

FIG. 10 shows a circuit diagram of the prior art reference of Japanese Patent Laid-Open Publication No. HEI 6-150688 (referred to as a first prior art reference hereinafter). According to the first prior art reference, a redundancy block 12 having a source line S different from that of a main block 11 is provided. In the main block 11 and the redundancy block 12, the source line S is commonly owned by memory cells connected to one word line W (this group of the memory cells that commonly own the source line is made to serve as one block), and a source line level supply circuit 13 is connected to each source line S. Then, by turning off the source line level supply circuit 13a of a defective block 14 and turning on the source line level supply circuit 13b of the redundancy block 12, the defective block 14 is replaced by the redundancy block 12.

According to the prior art reference of Japanese Patent Laid-Open Publication No. HEI 6-290597 (referred to as a second prior art reference hereinafter), as shown in FIG. 11, a main block 15 and a redundancy block 16 are provided, and the main block 15 and the redundancy block 16 are provided with the respective source line level supply circuits 17 and 18, similar to the first prior art reference. Then, the source lines S1 through Sn of the blocks that constitute the main block 15 and the source line level supply circuit 17 are connected to each other via fuses 19. Likewise, the source line Sx of the redundancy block 16 and the source line level supply circuit 18 are connected to each other via a fuse 20. Thus, when a defective block occurs, the fuse 19 provided for the source line S1 of the defective block 21 is broken, and the defective block 21 is replaced by the redundancy block 16.

However, the aforementioned ACT type flash memory has the following problems. That is, when erasing the ACT type flash memory, a negative voltage is applied to the channel region (P− region) of the transistor that constitutes each memory cell as described earlier. Therefore, as shown in FIG. 9, the disturbance from the selected block to the non-selected block cannot be avoided in the memory array formed on the p-well (p−) Therefore, when executing the erase operation by selecting a sector or a small block in the main block in the case where the redundancy block is provided in the memory array, there is the problem that the negative voltage is also applied to the channel region of the memory cell in the redundancy block put in the non-selected state, consequently causing a malfunction. Therefore, the redundancy function cannot be effected, causing the problem that the defective cell cannot be relieved in the main block.

Furthermore, the first prior art reference and the second prior art reference have the problems as follows. That is, in the first prior art reference, there is a need for providing the source line level supply circuit 13 for each block besides the row decoder (not shown) for selecting each word line W, and this is disadvantageous in terms of layout area. In the second prior art reference, one source line level supply circuit 17 is provided for the main block 15. However, it is required to provide the fuse 19 for the source line S of each block, and this leads to a disadvantage in terms of layout area similar to the first prior art reference.

SUMMARY OF THE INVENTION

Accordingly, the object of the present invention is to provide a nonvolatile semiconductor storage device that has a high reliability free from malfunction of the redundancy block during the erase operation as well as a redundancy function of which the layout area does not become a disadvantage.

In order to achieve the aforementioned object, the present invention provides a nonvolatile semiconductor storage device having a memory array in which control gates and drains of a plurality of memory cell transistors that have floating gates and are able to execute electrical writing and erasing of information are connected to word lines and bit lines arranged in a matrix form, the nonvolatile semiconductor storage device comprising:

a main block that constitutes part of the memory array and has a specified number of the memory cell transistors of which the control gates are connected to a first specified number of the word lines; and a redundancy block that constitutes the other part of the memory array, has a specified number of the memory cell transistors of which the control gates are connected to a second specified number of the word lines and is used for replacing a defective memory cell transistor in the main block, wherein the main block and the redundancy block being formed in regions that are electrically insulated from each other on a substrate.

According to the above construction, the main block and the redundancy block constituting the memory array are formed in the regions that are electrically insulated from each other on the substrate. Therefore, in the case where the memory array is the ACT flash memory array, the negative voltage is not applied to the substrate of the redundancy block when applying the negative voltage to, for example, the substrate of the main block for the execution of an erase operation by selecting a small block in the main block. With this arrangement, the disturbance to the redundancy block during the erase operation is avoided. As a result, the defective memory cell is correctly relieved by the redundancy block.

In an embodiment, a plurality of the redundancy blocks are provided and the redundancy blocks are formed in regions that are electrically insulated from one another on the substrate.

According to the above construction, the plurality of redundancy blocks are formed in the regions that are electrically insulated from each other on the substrate. Therefore, if defective memory cell transistors occur on different main blocks in the case where the memory array is the ACT flash memory array and a plurality of main blocks are existing, then the defective memory cell transistors existing in the respective main blocks can be replaced in the different redundancy blocks. Therefore, in the above case, when the information in the defective memory cell transistor on one main block is erased together with the information in the replacement memory cell transistor on the corresponding redundancy block, the disturbance to the other redundancy block is avoided. Thus, the defective memory cell is correctly relieved by the redundancy block.

In an embodiment, the second specified number is smaller than the first specified number.

According to the above construction, the number of word lines of the redundancy block is made smaller than the number of word lines of the main block in accordance with, for example, a rate of incidence of the defective sector in the main block. Thus, an increase in area of the memory array based on the incorporation of the redundancy function is suppressed.

An embodiment further comprises a redundancy control section to replace small blocks in the main block with the redundancy block, said small block being used as a unit for replacement.

According to the above construction, the replacement is executed in small blocks of a size smaller than the size of the main block under the control of the redundancy control section. Therefore, the size of the redundancy block is prevented from unnecessarily increasing, and the increase in area of the memory array based on the incorporation of the redundancy function is further suppressed.

In an embodiment, the redundancy control section effects the replacement with the redundancy block in batches of memory cell transistors of which the control gates are connected to one word line.

According to the above construction, the replacement is executed in batches of memory cell transistors of which the control gates are connected to one word line under the control of the redundancy control section. Therefore, the increase in area of the memory array based on the incorporation of the redundancy function is suppressed to a minimum.

In an embodiment, each of the memory cell transistors constituting the memory array is a memory cell transistor that executes writing of the information by extracting electrons from the floating gate through the application of a positive voltage not lower than a specified voltage to the drain and the application of a negative voltage to the control gate and executes erasing of the information by injecting electrons into the floating gate through the application of a negative voltage not higher than a specified voltage into the drain, source and channel region and the application of a positive voltage to the control gate, and the nonvolatile semiconductor storage device comprises:
a defective address storage section in which a defective address that represents an address of a defective memory cell transistor is stored; and
a redundancy control section that applies the negative voltage to the channel region of the main block corresponding to an objective address to be erased when the objective address to be erased is different from the defective address during an erase operation.

According to the above construction, in the memory array employing ACT, the negative voltage is not applied to the channel region of the redundancy block that is electrically insulated from the main block when applying the negative voltage to the channel region of the main block in order to execute the erase operation by selecting a small block in the main block. Therefore, the disturbance to the redundancy block in the erase operation is avoided. As a result, the defective memory cell is correctly relieved by the redundancy block.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
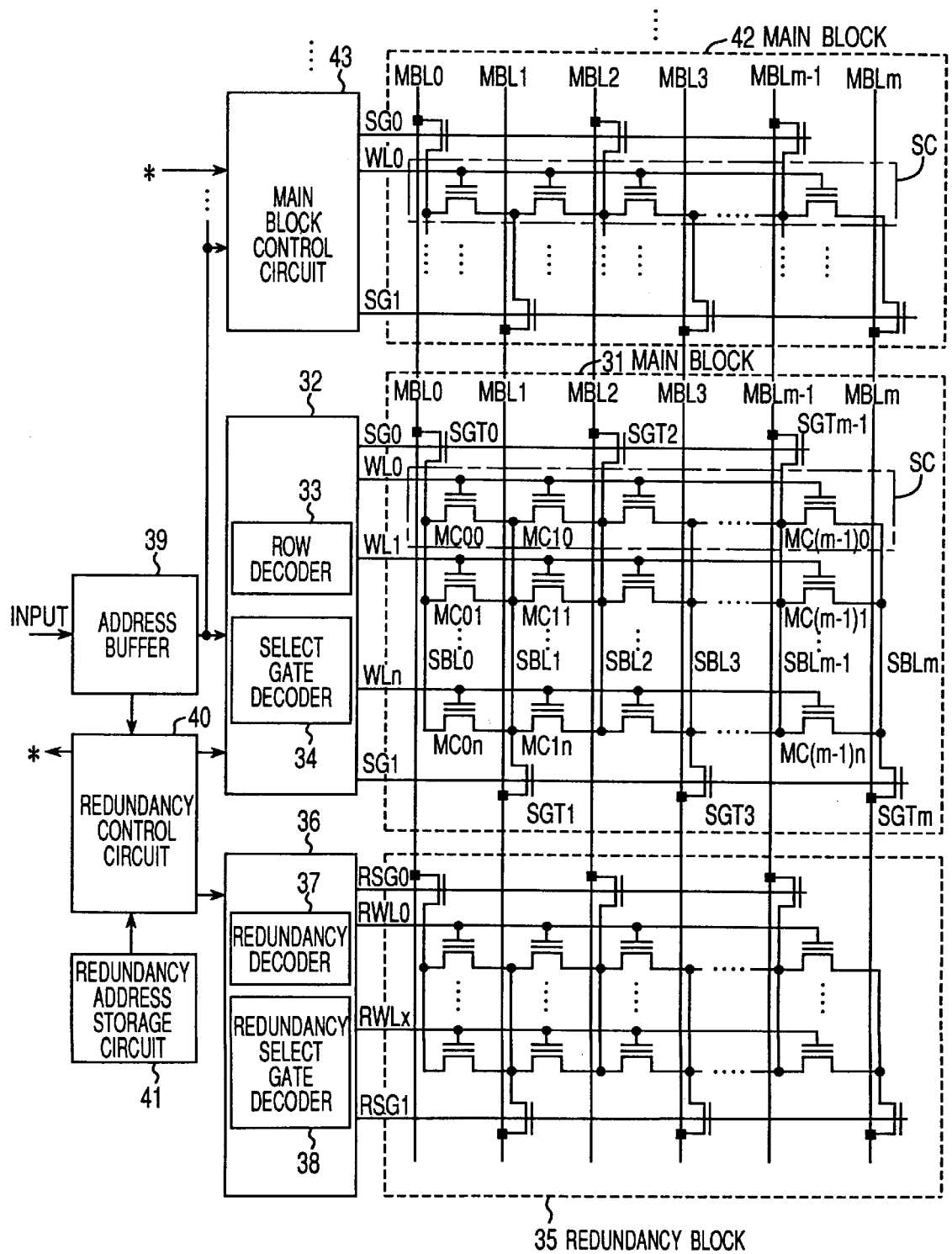
FIG. 1 is a circuit diagram of a memory array in a nonvolatile semiconductor storage device of the present invention.

The present invention will be described in detail below on the basis of the embodiments thereof shown in the drawings. FIG. 1 shows a circuit diagram of a memory array of a nonvolatile semiconductor storage device of the present embodiment. It is to be noted that the memory array of the present embodiment is a virtual ground type memory array.

Figure 8A:
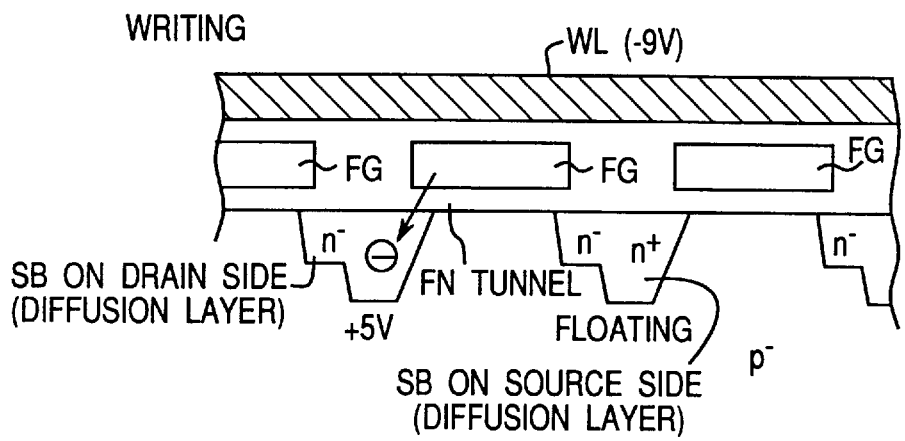
FIGS. 8A and 8B are explanatory views of the write and erase operations of the ACT type flash memory shown in FIG. 7.
Figure 8B:
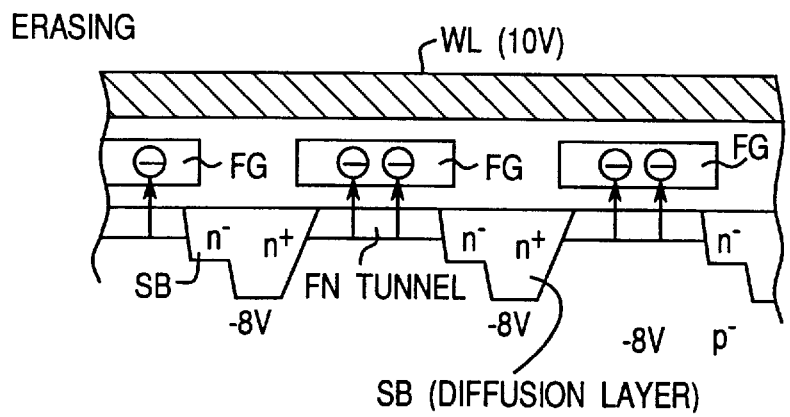
Figure 9:
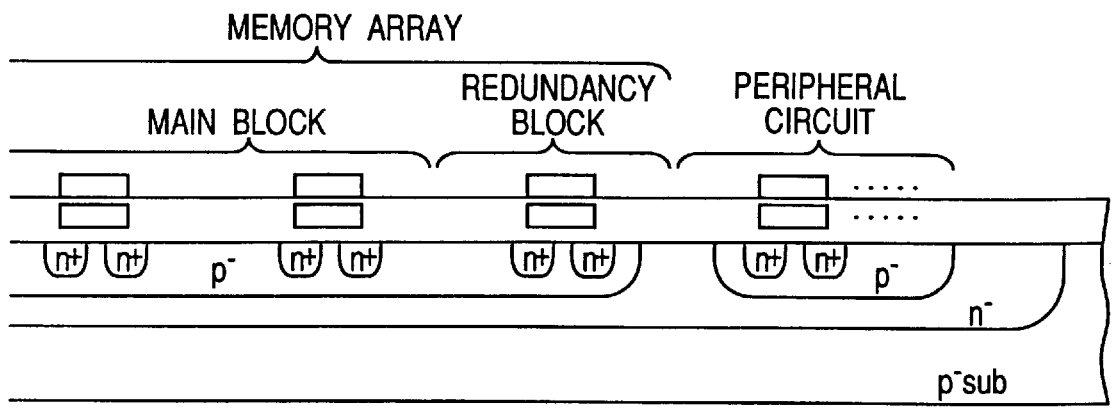
FIG. 9 is a schematic view showing a cross section of part of the memory array shown in FIG. 7.
Figure 10:
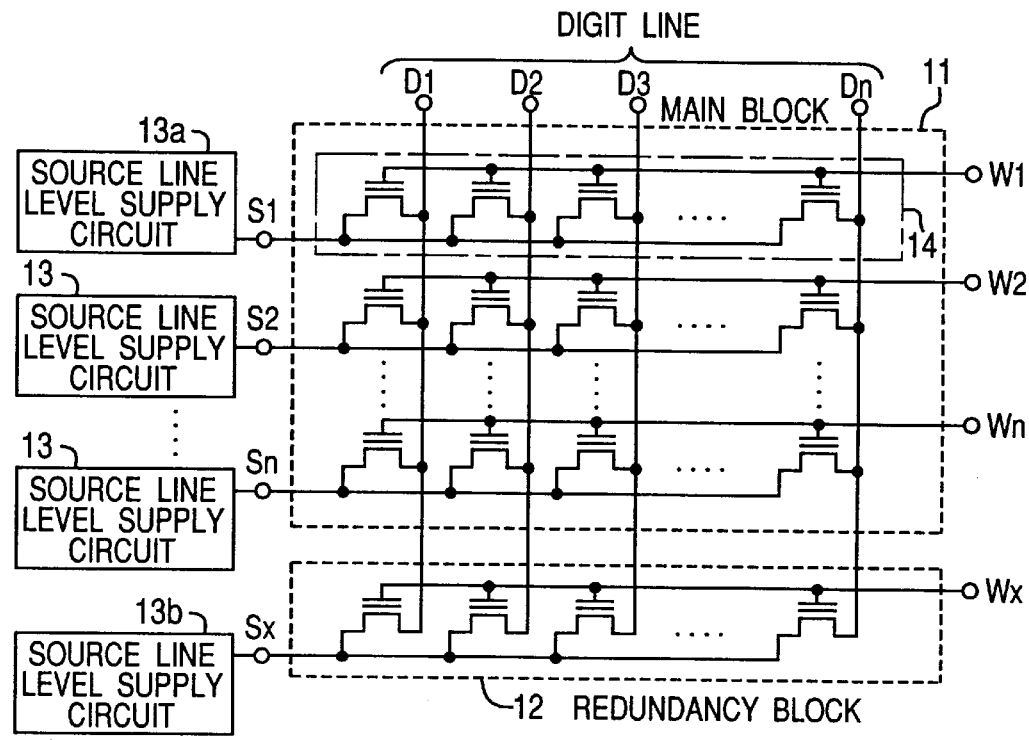
FIG. 10 is a diagram of a prior art redundancy block.
Figure 11:
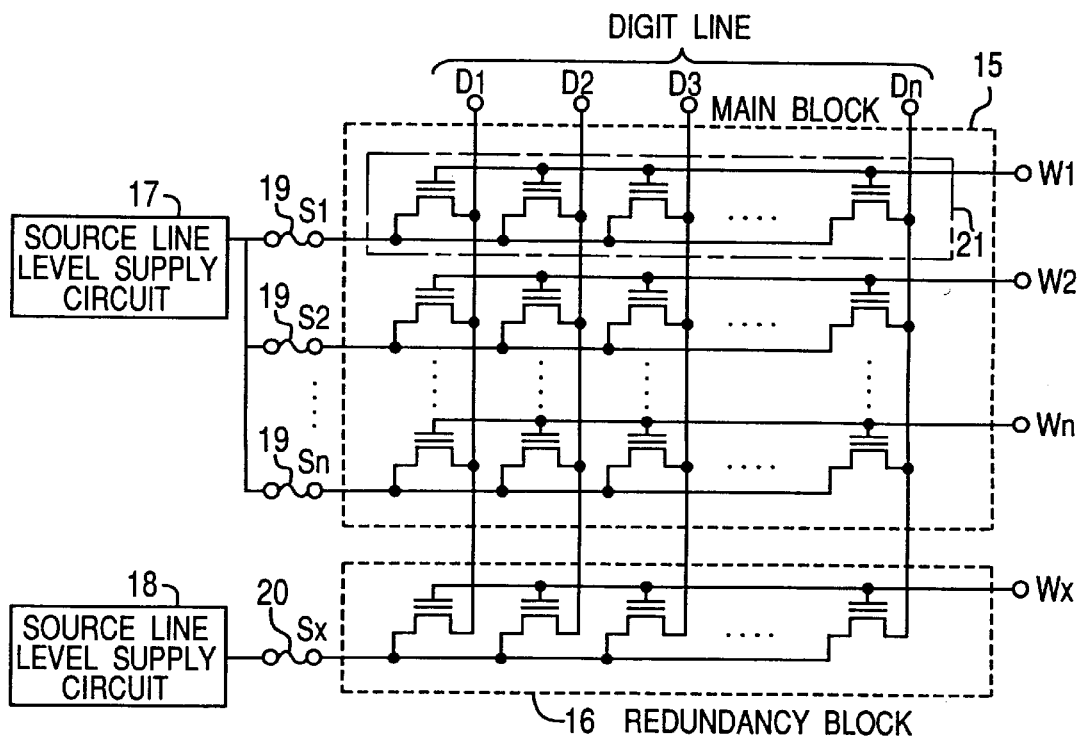
FIG. 11 is a diagram of a redundancy block different from that of FIG. 10.

A main block 31 in the present embodiment is constructed as follows. That is, (m+1) main bit lines MBL0, MBL1, . . . , MBLm are arranged parallel in one direction. Then, sub-bit lines SBL0, SBL2, . . . , SBLm−1 are connected to the contacts indicated by the mark ■ of the even-number main bit lines MBL0, MBL2, . . . , MBLm−1 via select gate transistors SGT0, SGT2, . . . , SGTm−1 of which the gates are commonly connected to the select gate line SG0. Likewise, sub-bit lines SBL1, SBL3, . . . , SBLm are connected to the contacts indicated by the mark ■ of the odd-number main bit lines MBL1, MBL3, . . . , MBLm via select gate transistors SGT1, SGT3, ..., SGTm of which the gates are commonly connected to the select gate line SG1. In this case, the sub-bit lines SBL0, ..., SBLm are constructed of diffusion regions $n^+$ and $n^-$ having asymmetrical concentrations as shown in FIGS. 8A and 8B.

To mutually adjacent sub-bit line SBL0 and sub-bit line SBL1 are connected parallel (n+1) ACT memory cells MC00, ..., MC0n. Likewise, to mutually adjacent sub-bit line SBL1 and sub-bit line SBL2 are connected parallel (n+1) ACT memory cells MC10, ..., MC1n. Likewise, to mutually adjacent sub-bit line SBLm−1 and sub-bit line SBLm are connected parallel (n+1) ACT memory cells MC(m−1)0, ..., MC(m−1)n. Thus, the ACT memory cells MC are arranged in a matrix form. Then, to the gates of the ACT memory cells MC00, ..., MC(m−1)0 of the first row is commonly connected a word line WL0. To the gates of the ACT memory cells MC01, ..., MC(m−1)1 of the second row is commonly connected a word line WL1. Likewise, to the gates of the ACT memory cells MC0n, ..., MC(m−1)n of the (n+1)th row is commonly connected a word line WLn.

The (n+1) word lines WL0, ..., WLn are connected to output terminals (not shown) of a row decoder 33 of a main block control circuit 32. The two select gate lines SG0 and SG1 are connected to output terminals (not shown) of a select gate decoder 34 of the main block control circuit 32. Then, the m ACT memory cells MC of one row connected to one word line WL are made to serve as one sector SC to be used as a unit of redundancy processing as described in detail later.

Further, a plurality of main blocks 42, ... and a plurality of main block control circuits 43, ... which have the same constructions as those of the main block 31 the main block control circuit 32 are arranged adjacent to the main block 31 having the aforementioned construction. Then, the plurality of main blocks 31, 42, ... commonly own main bit lines MBL0 through MBLm.

A redundancy block 35 provided adjacent to the main blocks 31, 42, ... has the same construction as that of the main block 31, and therefore, no detailed description is provided for them. It is to be noted that (x+1) ACT memory cells MC are connected between adjacent two sub-bit lines. That is, the redundancy block 35 has (x+1) redundancy sectors. In this case, by setting the number (x+1) of the redundancy sectors on the basis of the rate of incidence of the defective sectors in all the main blocks 31, 42, the size of the redundancy block 35 can be made sufficiently smaller than the size of all the main blocks 31, 42, ..., so that the increase in memory array area based on the incorporation of the redundancy function can be suppressed. It is to be noted that (x+1) redundancy word lines RWL0, ..., RWLx are connected to output terminals (not shown) of a redundancy decoder 37 of a redundancy block control circuit 36. Two redundancy select gate lines RSG0 and RSG1 are connected to output terminals (not shown) of a redundancy select gate decoder 38 of the redundancy block control circuit 36.

Figure 2:
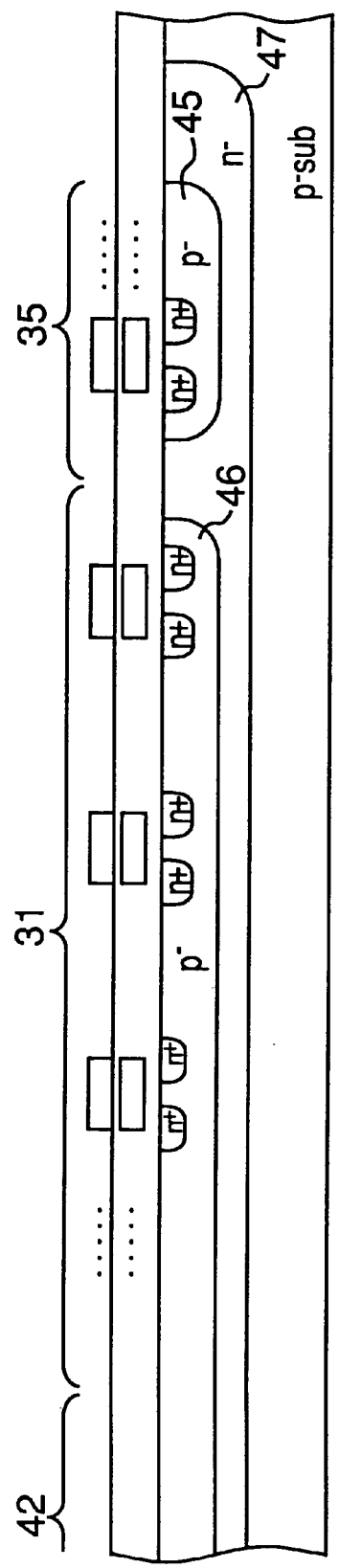
FIG. 2 is a schematic view showing a cross section of part of the memory array of FIG. 1.

The main blocks 31, 42, ... and the redundancy block 35 are formed on regions that are electrically insulated from each other. FIG. 2 is a schematic view showing the longitudinal cross section of the main blocks 31, 42, ... and the redundancy block 35. The redundancy block 35 and a series of main blocks 31, 42, ... are formed on different p-wells (p⁻) 45 and 46. Then, the p-wells 45 and 46 are formed on a common n-well (n⁻) 47, thereby forming a triple well. It is to be noted that the aforementioned peripheral circuits are not shown.

For example, when erasing the ACT memory cells MC in the main block 31, a negative voltage is applied to the p-well 46 located on the main block 31 side. On the other hand, by setting the voltage of the p-well 45 located on the redundancy block 35 side to zero volt, the ACT memory cells MC in the redundancy block 35 are not erased. In the above case, applying Vcc or zero volt to the n-well, or the common well, can prevent a current from flowing from the p-well to the n-well. In contrast to this, when erasing the ACT memory cells MC in the redundancy block 35, merely by inverting the voltages to be applied to the p-wells of the main block 31 and the redundancy block 35, only the ACT memory cells MC in the redundancy block 35 are erased, exerting no influence on the main block 31. It is to be noted that the writing has no problem since zero volt is applied to the p-wells of both the blocks 31 and 35. As described above, by forming the redundancy block 35 and a series of main blocks 31, 42, ... on the different p-wells in the triple well, the redundancy block 35 and a series of main blocks 31, 42, ... can be constructed while being electrically insulated from each other.

An address buffer 39 once stores the address inputted from, for example, a CPU (Central Processing Unit) or the like. A redundancy address storage circuit 41 stores the address of the word line WL connected to the defective cells of the main blocks 31, 42, ... (the address being referred to as a defective address hereinafter). A redundancy control circuit 40 compares the address inputted from the address buffer 39 with the defective address stored in the redundancy address storage circuit 41. If the input address is the defective address, then the redundancy control circuit 40 outputs a control signal to the redundancy block control circuit 36. It is to be noted that the row decoder 33 and the select gate decoder 34 of the main block control circuits 32, 43, ... determine which sector SC of the main blocks 31, 42, ... is to be accessed on the basis of the above address. The redundancy decoder 37 and the redundancy select gate decoder 38 of the redundancy block control circuit 36 access the redundancy sector corresponding to the defective address in the redundancy block 35 on the basis of the control signal from the redundancy control circuit 40.

The nonvolatile semiconductor storage device having the above construction executes the redundancy processing as follows. First, during the write operation, when the input address is stored into the address buffer 39, the redundancy control circuit 40 compares the input address with the defective address stored in the redundancy address storage circuit 41. If there is no defective address that coincides with the input address, then a negative voltage is applied to the word line WL designated by the input address received from the address buffer 39 by the row decoder 33 of the main block control circuit (assumed to be the main block control circuit 32 in this case) corresponding to the input address according to the control signal from the redundancy control circuit 40. In the meantime, the select gate line SG1 is selected by the select gate decoder 34 to apply a positive voltage to the sub-bit line (i.e., the odd-number sub-bit lines SBL1, SBL3, ...) located on the drain side, thereby executing the write operation. In contrast to this, if there is a defective address that coincides with the input address, then the row decoder 33 of the main block control circuit 32 stops accessing the word line WL designated by the input address according to the control signal from the redundancy control circuit 40. In the meantime, a negative voltage is applied to the redundancy word line RWL corresponding to the defective address in the redundancy block 35 on the basis of the control signal from the redundancy control circuit 40 by the redundancy decoder 37 of the redundancy block control circuit 36. In the meantime, the redundancy select gate line RSG1 is selected by the redundancy select gate decoder 38 to apply a positive voltage to the redundancy sub-bit line located on the drain side, thereby executing the write operation.

During the erase operation, when the input address is stored into the address buffer 39, the redundancy control circuit 40 compares the input address with the defective address stored in the redundancy address storage circuit 41. If there is no defective address that coincides with the input address, then a positive voltage is applied to the word line WL designated by the input address received from the address buffer 39 by the row decoder 33 of the main block control circuit (assumed to be the main block control circuit 32 in this case) corresponding to the input address according to the control signal from the redundancy control circuit 40. In the meantime, the select gate lines SG0 and SG1 are selected by the select gate decoder 34 to apply a negative voltage to all the sub-bit lines SBL. Then, the negative voltage is applied to the p-well 46 of the main block 31, thereby executing the erase operation. In contrast to this, if there is a defective address that coincides with the input address, then the row decoder 33 and the select gate decoder 34 of the main block control circuit 32 erase the sector SC of the word line WL designated by the input address according to the control signal from the redundancy control circuit 40. At the same time, a positive voltage is applied to the word line RWL corresponding to the defective address in the redundancy block 35 on the basis of the control signal from the redundancy control circuit 40 by the redundancy decoder 37 of the redundancy block control circuit 36. In the meantime, the redundancy select gate lines RSG0 and RSG1 are selected by the redundancy select gate decoder 38 to apply a negative voltage to all the redundancy sub-bit lines. Then, the negative voltage is applied to the p-well 45 of the redundancy block 35, thereby executing the erase operation of the redundancy sector.

As described above, in the present embodiment, the virtual ground type memory array employing the ACT memory cells MC is provided with the redundancy block 35 that employs the redundancy sector constructed of the ACT memory cells MC of one row connected to one redundancy word line RWL as a unit of redundancy, and this redundancy block 35 and a series of main blocks 31, 42, . . . are formed on different p-wells in the triple well while being electrically insulated from each other. With this arrangement, it is required to apply the negative voltage to only the p-well 46 located on the main blocks 31, 42, . . . side in erasing the information of the ACT memory cells MC in the main blocks 31, 42, . . . , when the information of the redundancy block 35 is not erased by setting the p-well 45 located on the redundancy block 35 side to zero volt. The same thing can be said for the converse case. That is, according to the present embodiment, a nonvolatile semiconductor storage device provided with a highly reliable redundancy function can be provided.

Since there is provided the redundancy function effective in batches of sectors SC smaller than the main blocks 31, 42, . . . , the size of the redundancy block 35 can be made smaller than the size of the main blocks 31, 42, . . . , and the layout area of the memory array can be reduced. Furthermore, there is no need for separately providing the source line level supply circuit as described in connection with the first prior art reference and the second prior art reference besides the main block control circuits 32, 43, . . . , so that no disadvantage occurs in terms of the layout area.

In the case where only one redundancy block is mounted as in the nonvolatile semiconductor storage device shown in FIG. 1, the defective sectors existing in different main blocks 31, 42, . . . are replaced by the redundancy sectors inside the single redundancy block 35. Therefore, if a negative voltage is applied to the p-well of the first main block and the p-well of the single redundancy block in order to execute the erase operation on the first main block in which a first defective sector is existing, then the redundancy sectors of the other main blocks are disturbed.

Figure 3:
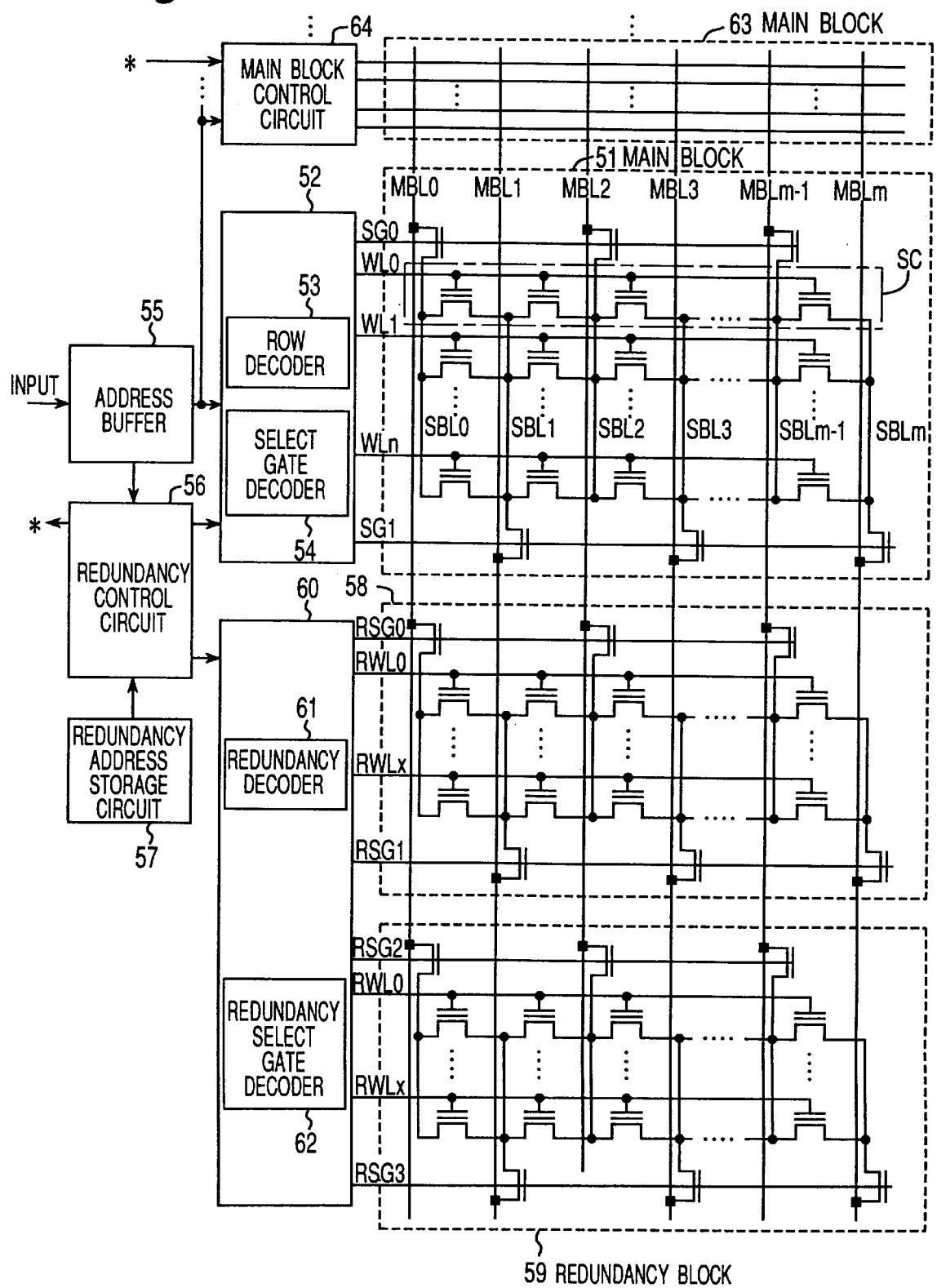
FIG. 3 is a circuit diagram of a memory array different from that of FIG. 1.
Figure 4:
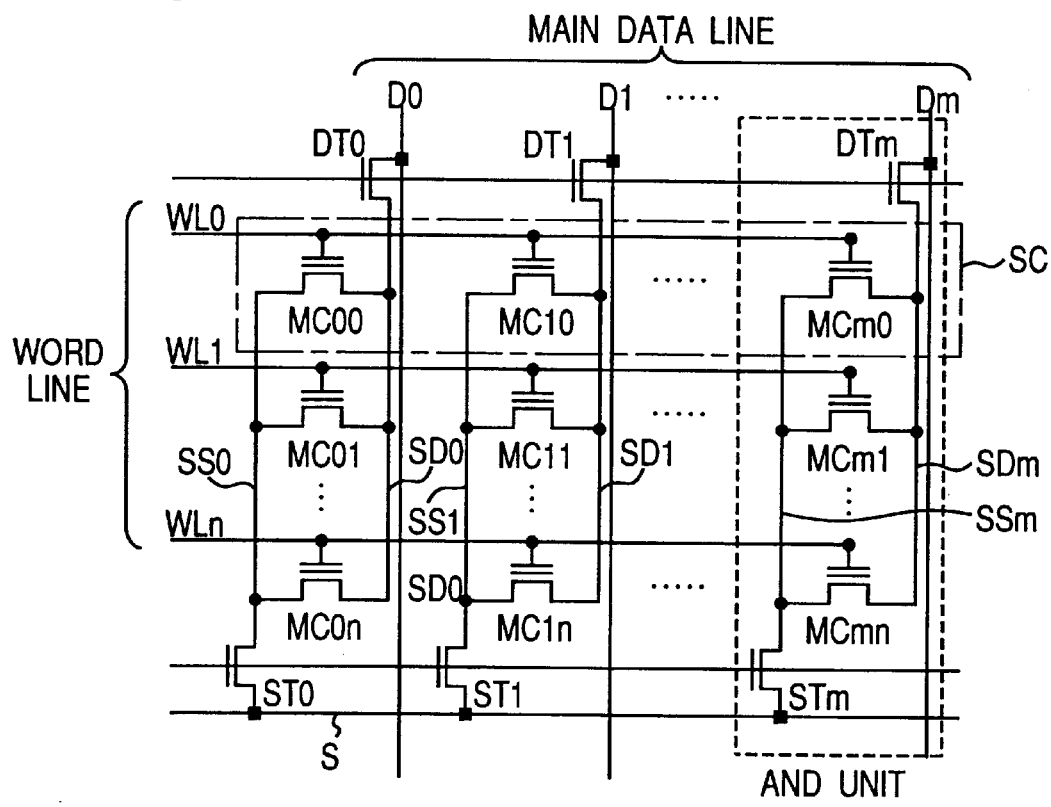
FIG. 4 is a diagram showing an array structure of a prior art AND type flash memory.
Figure 5A:
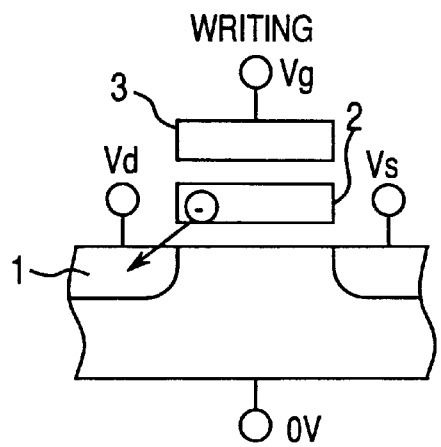
FIGS. 5A and 5B are explanatory views of the write and erase operations of the AND type flash memory shown in FIG. 4.
Figure 5B:
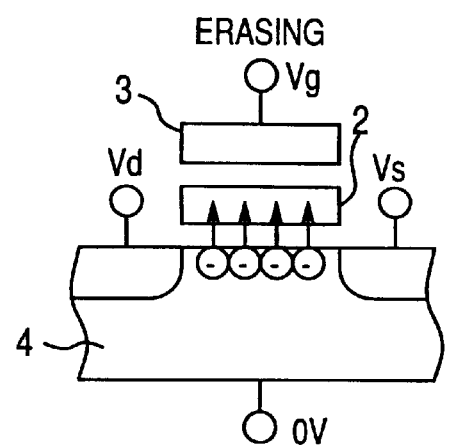
Figure 6:
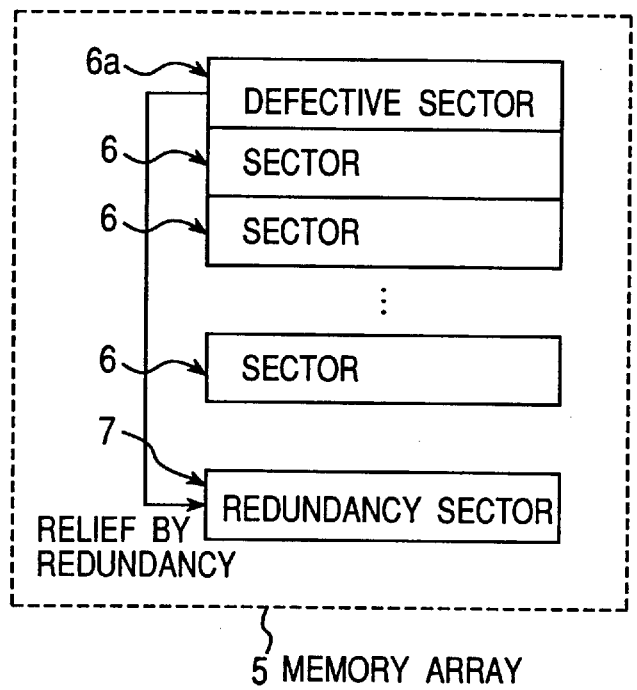
FIG. 6 is an explanatory view of a redundancy system of the AND type flash memory shown in FIG. 4.
Figure 7:
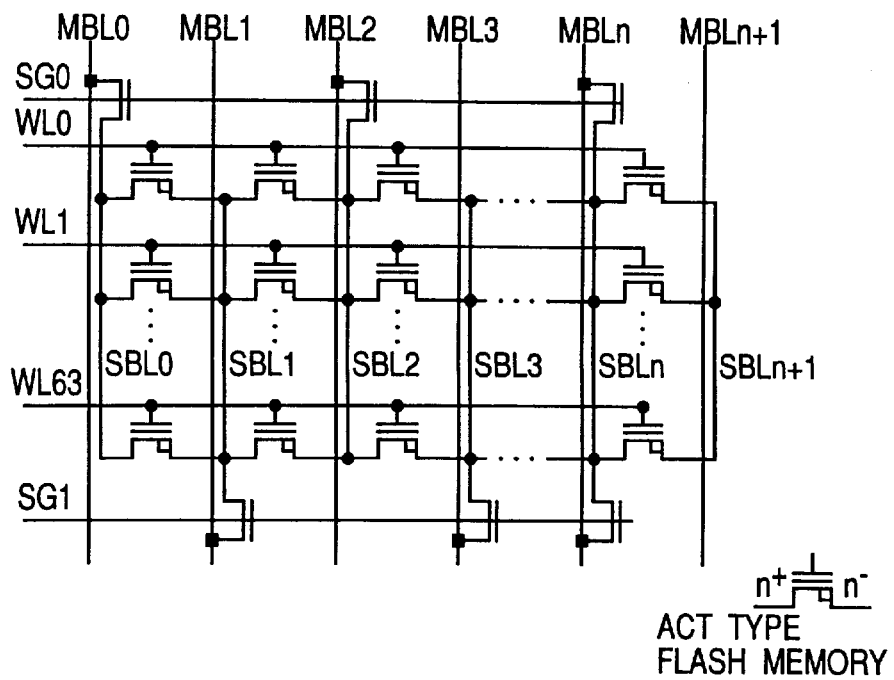
FIG. 7 is a diagram showing a memory structure of a prior art ACT type flash memory.

FIG. 3 is a circuit diagram of a nonvolatile semiconductor storage device having a redundancy function for solving the problems of the aforementioned nonvolatile semiconductor storage device shown in FIG. 1. Main blocks 51, 63, . . . , main block control circuits 52, 64, . . . , an address buffer 55, a redundancy control circuit 56 and a redundancy address storage circuit 57 in this nonvolatile semiconductor storage device have the same constructions as those of the main blocks 31, 42, . . . , main block control circuits 32, 43, . . . address buffer 39, redundancy control circuit 40 and redundancy address storage circuit 41, respectively, shown in FIG. 1.

The redundancy block of the present embodiment is constructed of a plurality of blocks of a first redundancy block 58 and a second redundancy block 59. Although the present embodiment is provided with the two redundancy blocks, the present invention is not limited to this. In the above case, by determining the number of redundancy blocks according to the rate of incidence of the defective main blocks, the optimum redundancy efficiency can be achieved. It is to be noted that the individual redundancy blocks 58 and 59 and a series of main blocks 51, 63, . . . are formed on different p-wells on a triple well, where the individual redundancy blocks 58 and 59 and a series of main blocks 51, 63, . . . are electrically insulated from each other.

The address buffer 55 once stores the inputted address. The redundancy address storage circuit 57 stores the address of the word line WL connected to the defective cells of the main blocks 51, 63, . . . (the address being referred to as a defective address hereinafter). The redundancy control circuit 56 compares the address inputted from the address buffer 55 with the defective address stored in the redundancy address storage circuit 57 and outputs a control signal depending on whether or not the input address is the defective address to the main block control circuits 52, 64, . . . and a redundancy block control circuit 60. Row decoders 53, . . . and the select gate decoder 54 of the main block control circuits 52, 64, . . . determine which sector of the main blocks 51, 63, . . . is to be accessed on the basis of the input address according to the above control signal. The redundancy decoder 61 and the redundancy select gate decoder 62 of the redundancy block control circuit 60 access the redundancy sector on the redundancy block associated with the defective address out of the two redundancy blocks 58 and 59 on the basis of the control signal from the redundancy control circuit 56.

As in the present embodiment, the plurality of redundancy blocks are mounted and the redundancy blocks are electrically insulated from one another. With this arrangement, if a defective sector occurs particularly in the plurality of main blocks, by associating the main blocks where the defective blocks are existing with the different redundancy blocks, when the negative voltage is applied to the p-well of the first main block 51 and the p-well of, for example, the associated first redundancy block 58 in order to execute the erase operation on, for example, the first main block 51 where the first defective sector is existing, the negative voltage is not applied to the p-well of the other redundancy block 59. Therefore, the redundancy blocks relevant to the other main blocks receive no disturbance.

As described above, in the present embodiment, the redundancy block is constructed of the plurality of blocks of the first redundancy block 58 and the second redundancy block 59. Then, by forming the individual redundancy blocks and a series of main blocks on different p-wells on the triple well, the individual redundancy blocks and a series of main blocks are electrically insulated from each other. Therefore, by associating the defective sectors occurring in the plurality of main blocks with different redundancy blocks, the other redundancy blocks receive no disturbance when executing the erase operation on the defective sector existing in, for example, the first main block 51 together with the redundancy sector. Therefore, according to the present embodiment, a nonvolatile semiconductor storage device provided with the redundancy function of a higher reliability can be provided.

It is to be noted that the aforementioned embodiments are described on the basis of the ACT memory cells employed as the memory cells, taken as an example. However, the present invention is not limited to this, and the invention can be applied to any flash memory of the type that employs a triple well. Although the present invention is described on the basis of the virtual ground type memory array, taken as an example, the present invention is not limited to this, and a flash memory of the NOR type or the AND type may also be employed.

As is apparent from the above description, according to the nonvolatile semiconductor storage device of the present invention, the main block constituting part of the memory array having the plurality of memory cell transistors that have floating gates and are able to execute electrical writing and erasing of information wherein the control gates of the memory cell transistors of the main block are connected to the first specified number of word lines, and the redundancy block that constitutes the other part of the memory array wherein the control gates of the memory cell transistors of the redundancy block are connected to the second specified number of word lines are formed in the electrically insulated regions on the substrate. With this arrangement, when the memory array is the ACT flash memory array, for example, the negative voltage is prevented from being applied to the substrate of the redundancy block in applying the negative voltage to the substrate of the main block for the execution of the erase operation on the main block. Therefore, the disturbance to the redundancy block is avoided during the erase operation on the main block. As a result, the defective memory cell is correctly relieved by the redundancy block.

Furthermore, there is existing a plurality of redundancy blocks in the nonvolatile semiconductor storage device of the embodiment, and the redundancy blocks are formed in the regions that are electrically insulated from one another on the substrate. Therefore, if defective memory cell transistors occur on different main blocks in the case where the memory array is the ACT flash memory array and a plurality of main blocks are existing, then the defective memory cell transistors existing in the respective main blocks can be replaced in the different redundancy blocks. Therefore, when erasing the replacement memory cell on the redundancy block corresponding to the defective memory cell transistor on one main block, the disturbance to the other redundancy blocks can be avoided. That is, according to this embodiment, the defective memory cells occurring in main blocks can be correctly relieved by the redundancy block even when the plurality of main blocks are existing.

Furthermore, the second specified number in the nonvolatile semiconductor storage device of an embodiment is made smaller than the first specified number, and therefore, the increase in area of the memory array based on the incorporation of the redundancy function can be suppressed.

The replacement of the redundancy block in the nonvolatile semiconductor storage device of an embodiment is executed in small blocks in the main block by the redundancy control section, and therefore, the size of the redundancy block can be prevented from unnecessarily increasing. Therefore, the increase in area of the memory array based on the incorporation of the redundancy function can be further suppressed.

The redundancy control section in the nonvolatile semiconductor storage device of an embodiment executes the replacement on the redundancy block in batches of memory cell transistors of which the control gates are connected to one word line. Therefore, the increase in area of the memory array based on the incorporation of the redundancy function can be suppressed to a minimum.

Each of the memory cell transistors that constitute the memory array in the nonvolatile semiconductor storage device of an embodiment is a memory cell transistor that executes the writing of the information by extracting electrons from the floating gate through the application of the positive voltage not lower than the specified voltage to the drain and the application of the negative voltage to the control gate and executes the erasing of the information by injecting electrons into the floating gate through the application of the negative voltage not higher than the specified voltage into the drain, source and channel region and the application of the positive voltage to the control gate. The redundancy control section applies the negative voltage to the channel region of the main block corresponding to the objective address to be erased when the objective address to be erased is different from the defective address stored in the defective address storage section. Therefore, the negative voltage can be prevented from being applied to the channel region of the redundancy block in applying the negative voltage to the channel region of the main block in order to execute the erase operation on the main block. Therefore, the disturbance to the redundancy block during the erase operation can be avoided, so that the defective memory cell can be correctly relieved by the redundancy block.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A nonvolatile semiconductor storage device having a memory array in which control gates and drains of a plurality of memory cell transistors that have floating gates and are able to execute electrical writing and erasing of information are connected to word lines and bit lines arranged in a matrix form, the nonvolatile semiconductor storage device comprising:

a main block that constitutes part of the memory array and has a specified number of the memory cell transistors of which the control gates are connected to a first specified number of the word lines; and a redundancy block that constitutes the other part of the memory array, has a specified number of the memory cell transistors of which the control gates are connected to a second specified number of the word lines and is used for replacing a defective memory cell transistor in the main block, wherein the main block and the redundancy block being formed in regions that are electrically insulated from each other on a substrate.

2. A nonvolatile semiconductor storage device as claimed in claim 1, wherein a plurality of the redundancy blocks are provided and the redundancy blocks are formed in regions that are electrically insulated from one another on the substrate.

3. A nonvolatile semiconductor storage device as claimed in claim 1, wherein the second specified number is smaller than the first specified number.

4. A nonvolatile semiconductor storage device as claimed in claim 1, further comprising a redundancy control section to replace small blocks in the main block with the redundancy block, said small block being used as a unit for replacement.

5. A nonvolatile semiconductor storage device as claimed in claim 4, wherein the redundancy control section effects the replacement with the redundancy block in batches of memory cell transistors of which the control gates are connected to one word line.

6. A nonvolatile semiconductor storage device as claimed in claim 1, wherein each of the memory cell transistors constituting the memory array is a memory cell transistor that executes writing of the information by extracting electrons from the floating gate through the application of a positive voltage not lower than a specified voltage to the drain and the application of a negative voltage to the control gate and executes erasing of the information by injecting electrons into the floating gate through the application of a negative voltage not higher than a specified voltage into the drain, source and channel region and the application of a positive voltage to the control gate, and the nonvolatile semiconductor storage device comprises:

a defective address storage section in which a defective address that represents an address of a defective memory cell transistor is stored; and a redundancy control section that applies the negative voltage to the channel region of the main block corresponding to an objective address to be erased when the objective address to be erased is different from the defective address during an erase operation.

* * * * *